United States Patent [19]

Tikhomirov

[11] Patent Number: 5,442,323
[45] Date of Patent: Aug. 15, 1995

[54] BROAD-BAND POWER AMPLIFIER

[76] Inventor: Sergey G. Tikhomirov, 1 Novosmolemscaya, St., Apt. 175, St. Petersburg, Russian Federation, 199397

[21] Appl. No.: 239,308

[22] Filed: May 6, 1994

[51] Int. Cl.⁶ ............................................. H03F 1/42
[52] U.S. Cl. .................... 330/292; 330/294; 330/306
[58] Field of Search ............... 330/76, 78, 94, 292, 330/294, 306

[56] References Cited

U.S. PATENT DOCUMENTS

| | | | |
|---|---|---|---|
| 3,044,022 | 7/1962 | Tongue | 330/78 |
| 3,332,020 | 7/1967 | Klank | 330/292 X |
| 4,468,630 | 8/1984 | Narukawa et al. | 330/267 |
| 4,611,179 | 9/1986 | Matsuura | 330/293 |
| 4,639,686 | 1/1987 | Beckenbach et al. | 330/307 |

FOREIGN PATENT DOCUMENTS

| | | |
|---|---|---|
| 1166270A | 7/1985 | U.S.S.R. |
| 1256141A1 | 9/1986 | U.S.S.R. |
| 1290476A1 | 2/1987 | U.S.S.R. |
| 1385249A1 | 3/1988 | U.S.S.R. |
| 1411919A1 | 7/1988 | U.S.S.R. |
| 1478291A1 | 5/1989 | U.S.S.R. |
| 1483595A1 | 5/1989 | U.S.S.R. |
| 1584075A1 | 8/1990 | U.S.S.R. |
| 1603526A1 | 10/1990 | U.S.S.R. |
| 1635246A1 | 3/1991 | U.S.S.R. |
| 1653127A1 | 5/1991 | U.S.S.R. |
| 1716593A1 | 2/1992 | U.S.S.R. |

*Primary Examiner*—James B. Mullins
*Attorney, Agent, or Firm*—Marshall, O'Toole, Gerstein, Murray & Borun

[57] ABSTRACT

A broad-band power amplifier circuit having a transistor with a base terminal, an emitter terminal, and a collector terminal connected between a positive power source terminal and a negative power source terminal. A bias circuit is connected to the base terminal of the transistor, a capacitor is connected between the collector and emitter terminals of the transistor, and an inductor is connected between the emitter terminal of the transistor and the negative power source terminal. A decoupling choke is connected between the collector terminal of the transistor and the positive power source terminal, a first decoupling capacitor is connected to the collector terminal of the transistor, and a second decoupling capacitor is connected to the base terminal of the transistor.

11 Claims, 3 Drawing Sheets

BROAD-BAND POWER AMPLIFIER

BACKGROUND OF THE INVENTION

The present invention relates to broad-band power amplifier circuits for use in radio engineering applications.

Broad-band transistor power amplifiers use stages in which transistors are usually connected according to a common-base, a common-emitter or a common-collector configuration. The common-emitter configuration has a number of advantages which make it widely used. Advantages of a common-emitter transistor stage are maximum stage amplification and very high stability during its performance with a mismatched load. Because of internal time lags, its input and output impedances are highly dependent on frequency.

To ensure optimum operation of the amplifier stage, the input and output circuits of the amplifier should be arranged in such a way that these frequency dependencies are compensated; that is, the output voltage and output current amplitudes of the transistor in the frequency pass band should be maintained constant. To take this into account, the input and output matching circuits must be calculated based on dummy transistor circuits, ensuring the most effective energetic operating modes of the transistor and of the drive generator.

In British Patent Document No. 1,577,467, an amplifier circuit incorporates a transistor having a base connected to a signal source through matching components forming an upper frequency filter, ending with a capacitor, and a collector connected to a load through matching components forming a lower frequency filter, ending in an inductance. The emitter is directly connected to a common bus.

Use of the matching circuits as filters makes the amplifier lay-out and structure complicated because these filters have to be calibrated, manufactured and separately tuned. The direct connection of the emitter to the common bus results practically in complete amplifier input-output circuit isolation which causes its fundamental frequency band limitation according to the Baudet theorem. Also, the direct connection of the emitter to the common bus limits the dynamic signal bandwidth in the load because in this case it is only the transistor which supplies the high-frequency power to the load. In this case the amplifier output power cannot be greater than that generated by the transistor.

In Soviet Patent Document No. 1,166,270, a broad-band amplifier circuit incorporates a transistor and an output transformer provided in the form of a long line. The primary transformer winding is made with a tap and has a first output connected to a supply source and a second output connected to the collector terminal of the transistor through a choke. The tap is connected to a first output of a voltage divider connected to the transistor and to a load through a capacitor. A second output of the voltage divider is connected to the common bus of the amplifier, and a medium point of the voltage divider is connected to the base terminal of the transistor and to an excitation source through a second capacitor. The secondary transformer winding is switched on between the transistor emitter and the common bus. A resistor is connected parallel to the secondary transformer winding.

Availability of the negative feedback owing to the connection of the transformer secondary winding to the emitter circuit results in the broadening of the amplifier pass band. The transformer implementation on the basis of a long line also contributes to the broadening of the pass band.

The choke forms, in combination with transistor's capacitance and stray mounting capacitance, a low-pass filter which additionally improves the amplifier frequency characteristic in the high-frequency band. The resistor connected in parallel to the transformer secondary winding eliminates the influence of the spurious capacitive coupling between transformer windings on the shape of the amplifier frequency characteristic.

One disadvantage of this design is the required complexity and plethora of components, including the long-line transformer, which substantially complicates the device as a whole and makes miniaturization of the circuit impossible. Another disadvantage is the fact that the filter, being formed by the choke and the transistor capacitance, has a restricted pass band. As a consequence of this, the upper operating frequency band remains relatively low. The resistor connected in parallel to the transformer secondary winding also enhances losses in the stage, which lowers its output power.

It is known that in some amplifying stage implementations, such as that disclosed in a Soviet publication entitled "Broad Band Radio Transmitting Devices," pp. 43–44, edited by O. Alexeew, et al., the output matching circuit includes a capacitor connecting a collector and an amplifier to a common bus and a transistor emitter connected directly to the common bus. The purpose of such a capacitor is to reduce the output-matching frequency band; i.e. in forming a high-pass filter at the stage end having a cut-off frequency lower than that allowed by the output (collector) capacitance of the transistor itself. The necessity of connecting such a capacitor arises in a special case where there is a need to substantially narrow and limit the output matching bandwidth, for instance, in order to cut off the high harmonic components of the signal.

SUMMARY OF THE INVENTION

The invention relates to a broad-band amplifier having a wider band of operating frequency, higher output power, and simple construction. In accordance with the invention, a broad-band amplifier circuit is provided with a bipolar transistor having a base terminal, an emitter terminal and a collector terminal. A capacitor is connected in parallel across the emitter terminal and the collector terminal, and an inductor is connected between the emitter terminal and a common bus. The use of the capacitor connected in parallel with the emitter and the collector terminals of the transistor shorts the reactive component of the transistor emitter current, and this together with the use of the inductor connected between the emitter output of the transistor and the common bus makes it possible to increase the operating frequency bandwidth and output power of the amplifier.

A bias circuit is connected to the base terminal of the transistor. The bias circuit may include a first resistor connected to the base of the transistor and a second resistor connected between the base of the transistor and the negative power source terminal. The amplifier circuit may also include a decoupling choke connected between the collector terminal of the transistor and a positive power source terminal, a first decoupling capacitor connected to the collector terminal of the transistor, and a second decoupling capacitor connected to the base terminal of the transistor.

In the amplifier circuit in accordance with the invention, the connection of the capacitor between the emitter and collector terminals of the transistor in conjunction with the use of the inductor connected between the transistor emitter output and the common bus make it possible to neutralize the input and output capacitance of the transistor and to transmit high-frequency power, absorbed at the amplifier input, into the load. As a result, a number of advantageous effects are achieved, including broadening of the amplifier operating frequency range, simplification of the amplifier structure by excluding from its circuit complicated matching circuits, the opportunity for miniaturization of the amplifier circuit by means of manufacturing of transistors with built-in reactivenesses, and an increase in the highest achievable amplifier power, which may far surpass the power generated by the amplifier transistor.

Furthermore, another advantage is the ability to cascade, or connect in series, a number of amplifiers in accordance with the invention by simply connecting the output of one amplifier stage to the input of the following amplifier stage via a blocking capacitor.

Additional features and advantages of the present invention will be apparent to those of ordinary skill in the art in view of the detailed description of the preferred embodiment, which is made with reference to the drawings, a brief description of which is provided below.

DETAILED DESCRIPTION OF A PREFERRED EMBODIMENT

Figure 1:
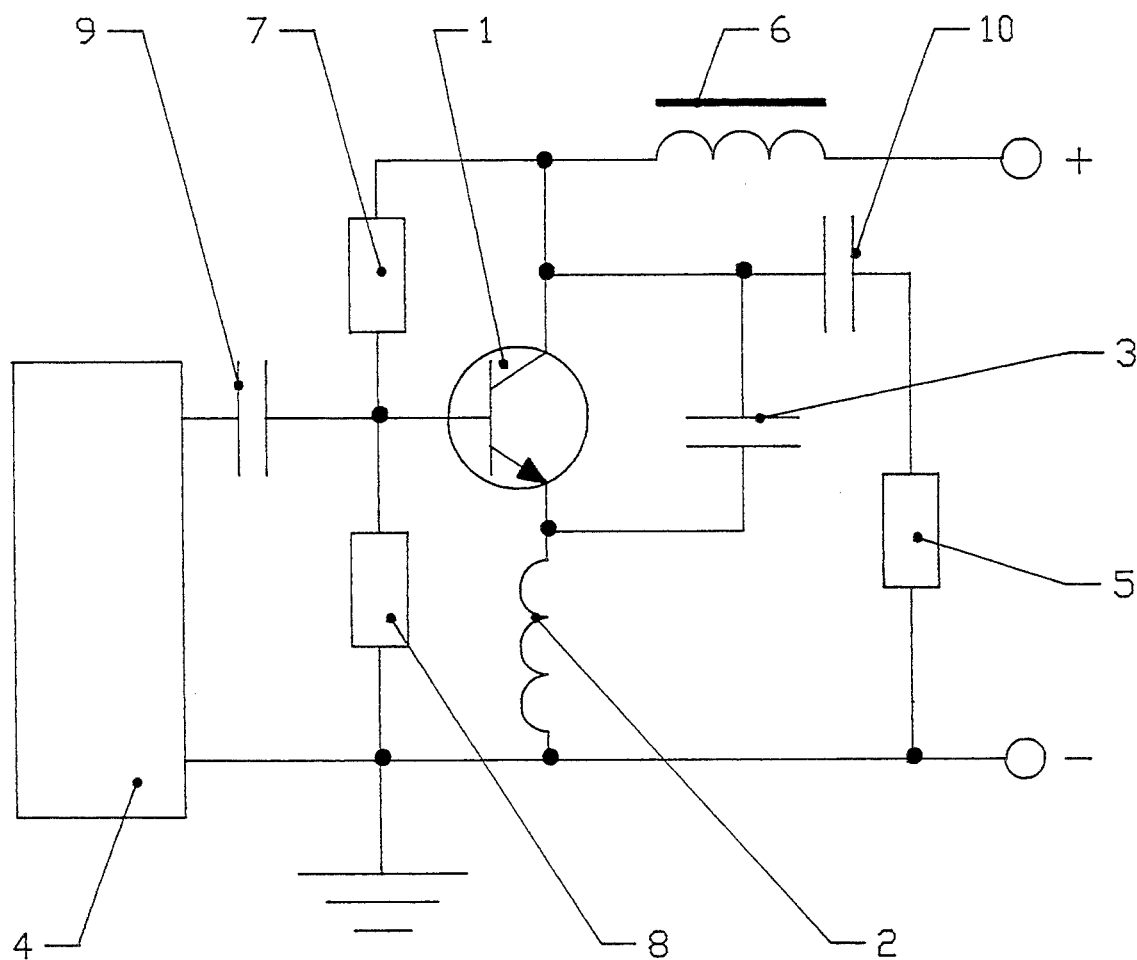
FIG. 1 is a circuit diagram of one embodiment of an amplifier circuit in accordance with the invention.

A circuit diagram of a preferred embodiment of a broad-band amplifier is shown in FIG. 1 to include a bipolar transistor 1, connected in common-emitter configuration, having base, emitter and collector terminals. An inductor 2 is connected between the emitter terminal of the transistor 1 and a common bus or negative power source terminal (−). A capacitor 3 is connected between and in parallel with the collector and emitter terminals of the transistor 1. The base terminal of the transistor 1 is coupled to an excitation source 4 for the amplifier, and the amplifier is connected to a load 5. The excitation source 4 may be a preceding amplification stage or a high frequency generator.

The amplifier's supply voltage is fed from a positive power source terminal (+) through a decoupling choke 6. A shift is imparted to the base terminal of the transistor 1 via a bias circuit provided in the form of a voltage divider circuit composed of a pair of resistors 7, 8. A first decoupling capacitor 9 is connected between the base terminal of the transistor 1 and the excitation source 4, and a second decoupling capacitor 10 is connected between the collector terminal of the transistor 1 and the load 5.

As described in more detail below in connection with the operation of the amplifier, the values of capacitor 3 and the inductor 2, which act as matching components, are calculated to neutralize the reactive component's input and output time lags.

Figure 2:
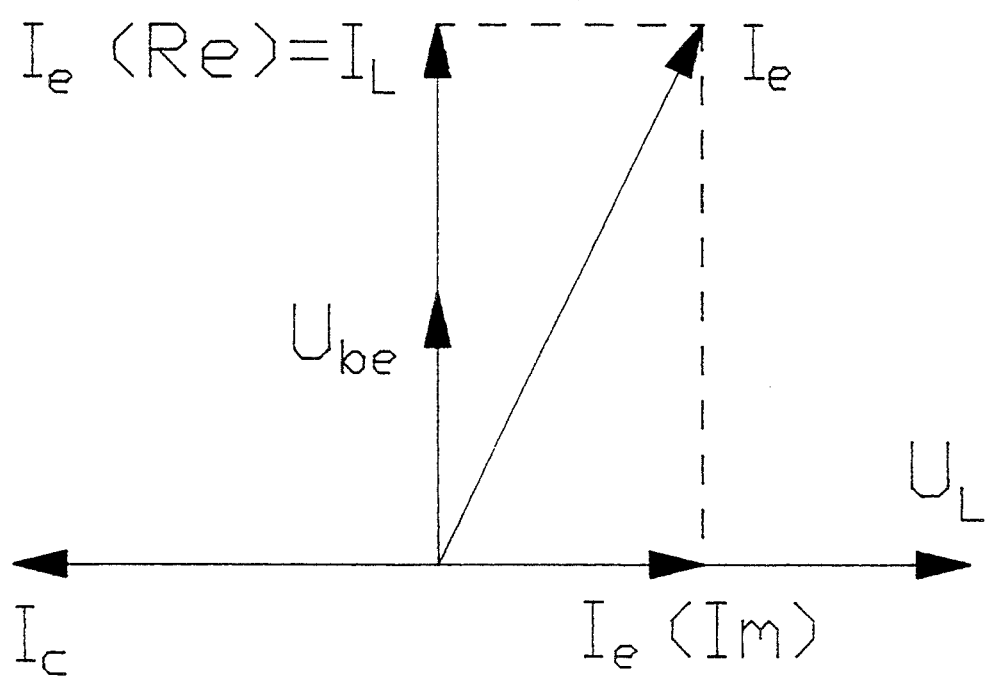
FIGS. 2 and 3 illustrate vector diagrams of the currents and voltages during the operation of the amplifier circuit of FIG. 1.

The amplifier operation is described in connection with the vector diagrams shown in FIGS. 2 and 3. The input voltage $U_{IN}$ is applied to the base terminal of the transistor 1 from the excitation source 4. The emitter current $I_e$ of the transistor 1 has an active (real) high-frequency component $I_e(Re)$ which is cophasal with (has the same phase as) the base-emitter voltage $U_{be}$ of the transistor 1 and a reactive (imaginary) high-frequency component $I_e(Im)$, which is shifted at $(n/2)$ in relation to voltage $U_{be}$. The current $I_L$ passing through the inductor 2 is formed from the emitter current $I_e$ and from current $I_c$ passing through the capacitor 3 and being shifted by $(-\pi/2)$ in relation to the voltage $U_{be}$. The capacitance of the capacitor 3 is selected so that the current $I_c$ flowing through the capacitor 3 will compensate the emitter current component $I_e(Im)$, and current $I_L$ flowing through the inductor 2 will coincide by its value and phase with the emitter current component $I_e(Re)$ and be cophasal with the control voltage $U_{be}$.

Figure 3:
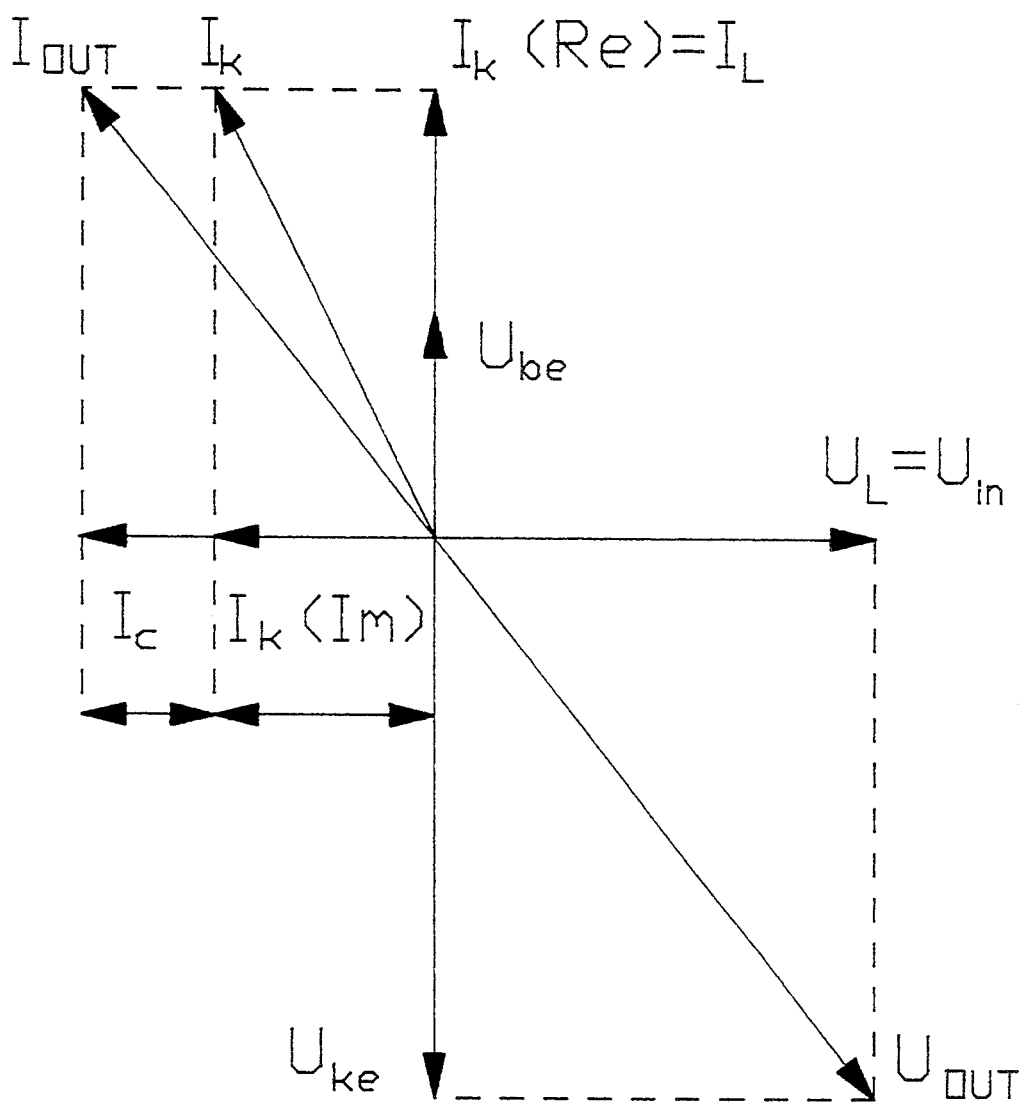

Referring to FIG. 3, the collector current $I_k$ of the transistor 1 has an active (real) high-frequency component $I_k(Re)$, cophasal with $U_{be}$, and a reactive (imaginary) high-frequency component $I_k(Im)$ which is shifted at $(-n/2)$ in relation to $U_{be}$. The current $I_{OUT}$ flowing in the load 5 consists of the collector current $I_k$ and the capacitor current $I_c$ (as mentioned above, the current $I_c$ is also shifted at $(-n/2)$ in relation to $U_{be}$). Thus, the voltage $U_{OUT}$ on the collector output (on the load 5) is shifted in relation to $U_{be}$ at an angle between $(n/2)$ and $(n)$. The voltage $U_{ke}$ across the collector and emitter terminals of the transistor 1 is equal to the difference between $U_{OUT}$ and $U_L$ (the voltage on the inductor 2). As may be seen in FIG. 2, with an appropriate choice of the inductor 2 value, which determines the voltage $U_L$, the collector-emitter voltage $U_{ke}$ of the transistor 1 is strictly antiphasal to the base-emitter voltage $U_{be}$. Thus the voltage between the collector and the emitter of the transistor, $U_{ce}$, will be opposite in phase to an active component of the transistor collector current, which provides the most effective power transmission from the transistor 1 onto the load 5 and consequently the output matching of the transistor 1 with the load 5.

As is known, the base current of a transistor, matched on its output, is shifted at $(n/2)$ in relation to the voltage $U_{be}$ between the base and emitter terminals of the transistor. The transistor 1 base current $I_b$ is the input current for the amplifying stage at this transistor. The stage input voltage coincides with the voltage at the transistor 1 base output. It does not practically differ from the high-frequency voltage $U_e$ at the emitter output, which is equal to the voltage $U_L$ and is shifted at $(n/2)$ in relation to $U_{be}$. Therefore, the input current and the input voltage of the amplifying stage at transistor 1 are cophasal, which is indicative of the amplifier's input phase match.

Consequently, the amplifier in accordance with the invention is fully input/output matched without the need to employ complicated matching circuits. It should also be noted that the active value of the amplifier input resistance is equal to the high-frequency absorption at the amplifier input. Since practically, the whole lowering of the input voltage takes place at pure reactive component, that is, at an inductance, the power being absorbed at the amplifier's input is not dissipated in the transistor 1, but is transmitted to the load 5 where it is summed up with the high-frequency power generated by transistor 1 itself.

Thus, the amplifier provides a summing up of powers, ensuring in such a way an increase in the output power. Depending on the magnitudes of the capacitor 3 and the inductor 2 values, the amplifier input/output matching frequency range (and hence the amplifier operating frequency range) may be different.

If the values of the inductor 2 and the capacitor 3 are chosen to achieve equality of the amplifier input resistance and the load resistance, then theoretically there are no limitations on the upper frequency at all of the amplifier in accordance with the invention. At very high frequencies, however, the adverse effect of spurious capacitances and inductances show up, but a traditional amplifier circuit is not operable at such high frequencies. In this case the inductance value L of the inductor 2 and the capacitance value C of the capacitor 3 are given by the following equations:

$$L = R/(2\pi \times f_T) + R^2 \times C_c, \quad C = 1/(2\pi \times f_T \times R),$$

where R is the resistance of the amplifier load 5, $C_c$ is the output capacitance of the transistor 1, and $f_T$ is the current gain-bandwidth product.

A slight reduction of the power-amplification factor which takes place in the amplifier at relatively high frequencies may be easily compensated for by cascade-connecting a plurality of amplifier stages as described above. This will not reduce efficiency since, due to the above-mentioned effect of cascade power summing, the high-frequency power supplied to the input of each amplifier stage will not be lost, but will be completely transmitted to the load.

Modifications and alternative embodiments of the invention will be apparent to those skilled in the art in view of the foregoing description. This description is to be construed as illustrative only, and is for the purpose of teaching those skilled in the art the best mode of carrying out the invention. The details of the structure and method may be varied substantially without departing from the spirit of the invention, and the exclusive use of all modifications which come within the scope of the appended claims is reserved.

What is claimed is:

1. A broad-band power amplifier circuit having a current gain-bandwidth product and usable with an amplifier load having a resistance, said amplifier circuit comprising:
   a transistor having a base terminal, an emitter terminal, a collector terminal and an output capacitance;
   a bias circuit connected to said base terminal of said transistor;
   a capacitor connected between said collector terminal and said emitter terminal of said transistor, said capacitor having a capacitance value C in accordance with the following equation:

$$C = 1/(2\pi \times f_T \times R),$$

where R is said resistance of said amplifier load and where $f_T$ is said current gain-bandwidth product; and an inductor connected to said emitter terminal of said transistor, said inductor having an inductance value L in accordance with the following equation:

$$L = R/(2\pi \times f_T) + R^2 \times C_c,$$

where R is said resistance of said amplifier load and where $C_c$ is said output capacitance of said transistor.

2. An amplifier circuit as defined in claim 1 additionally comprising a positive power source terminal and a negative power source terminal, said inductor being connected between said negative power source terminal and said emitter of said transistor.

3. An amplifier circuit as defined in claim 2 additionally comprising a decoupling choke connected between said collector terminal of said transistor and said positive power source terminal.

4. An amplifier circuit as defined in claim 3 wherein said bias circuit comprises:
   a first resistor connected to said base of said transistor; and
   a second resistor connected between said base of said transistor and said negative power source terminal.

5. An amplifier circuit as defined in claim 4 additionally comprising a decoupling capacitor connected to said collector terminal of said transistor.

6. An amplifier circuit as defined in claim 4 additionally comprising a decoupling capacitor connected to said base of said transistor.

7. A broad-band power amplifier circuit having a current gain-bandwidth product and usable with an amplifier load having a resistance, said amplifier circuit comprising:
   a transistor having a base terminal, an emitter terminal, a collector terminal and an output capacitance;
   a bias circuit connected to said base terminal of said transistor;
   a capacitor connected between said collector terminal and said emitter terminal of said transistor, said capacitor having a capacitance value C in accordance with the following equation:

$$C = 1/(2\pi \times f_T \times R),$$

where R is said resistance of said amplifier load and where $f_T$ is said current gain-bandwidth product;
   a negative power source terminal; and
   an inductor connected to said emitter terminal of said transistor, said inductor having an inductance value L in accordance with the following equation:

$$L = R/(2\pi \times f_T) + R^2 \times C_c,$$

where R is said resistance of said amplifier load and where $C_c$ is said output capacitance of said transistor.

8. An amplifier circuit as defined in claim 7 additionally comprising a decoupling choke connected to said collector terminal of said transistor.

9. An amplifier circuit as defined in claim 7 wherein said bias circuit comprises:
   a first resistor connected to said base of said transistor; and
   a second resistor connected between said base of said transistor and
   said negative power source terminal.

10. An amplifier circuit as defined in claim 7 additionally comprising a decoupling capacitor connected to said collector terminal of said transistor.

11. An amplifier circuit as defined in claim 7 additionally comprising a decoupling capacitor connected to said base of said transistor.

* * * * *